US011363578B2

(12) United States Patent
Luo et al.

(10) Patent No.: US 11,363,578 B2
(45) Date of Patent: Jun. 14, 2022

(54) METHOD AND DEVICE FOR DETECTING DISCONTINUOUS TRANSMISSION (DTX) FOR SMALL BLOCK ENCODED SIGNALS

(71) Applicant: Hong Kong Applied Science and Technology Research Institute Co., Ltd., Shatin (HK)

(72) Inventors: Yaming Luo, Kwan Tong (HK); Man Wai Kwan, Shatin (HK); Xiangyu Liu, Guangdong (CN); Kanghao Jia, Tai Po (HK); Kong Chau Tsang, Kowloon (HK)

(73) Assignee: Hong Kong Applied Science and Technology Research Institue Company Limited, Shatin (HK)

( * ) Notice: Subject to any disclaimer, the term of this patent is extended or adjusted under 35 U.S.C. 154(b) by 303 days.

(21) Appl. No.: 16/827,883

(22) Filed: Mar. 24, 2020

(65) Prior Publication Data
US 2021/0307000 A1 Sep. 30, 2021

(51) Int. Cl.
*H04W 72/04* (2009.01)
*H04W 76/28* (2018.01)
(Continued)

(52) U.S. Cl.
CPC ..... *H04W 72/0413* (2013.01); *H03M 13/136* (2013.01); *H04L 5/0055* (2013.01); *H04L 27/2636* (2013.01); *H04W 76/28* (2018.02)

(58) Field of Classification Search
None
See application file for complete search history.

(56) References Cited

U.S. PATENT DOCUMENTS

| 4,676,456 A * | 6/1987 | Grosso ............. F41G 7/222 244/3.21 |
| 6,289,000 B1 * | 9/2001 | Yonge, III ............. H04L 1/0052 375/346 |

(Continued)

FOREIGN PATENT DOCUMENTS

| CN | 104168094 A | 11/2014 |
| CN | 102740316 B | 1/2016 |

(Continued)

OTHER PUBLICATIONS

Du, Yifan et al. "An Improved Semi-blind Detection Algorithm for NR PUCCH," 2019 IEEE 5th Intern. Conference Dec. 6, 2019.

(Continued)

*Primary Examiner* — Hassan A Phillips
*Assistant Examiner* — Gautam Sharma (57) ABSTRACT

Described is a method and device for processing a signal received at an uplink control information (UCI) receiver in a wireless communication system. The method comprises processing a signal received on an uplink (UL) at said UCI receiver to transform said received signal into a likelihood calculation of possible transmitted codewords ($\theta_1 \ldots \theta_i \ldots \theta_N$). The likelihood calculation of possible transmitted codewords ($\theta_1 \ldots \theta_i \ldots \theta_N$) may comprise a multi-dimensional discrete Fourier transform (DFT) ($\theta_1 \ldots \theta_i \ldots \theta_N$) of said received signal. The multi-dimensional may be formed as a Hadamard Transform. The method includes determining a maximum magnitude $\theta_{max}$ value from said likelihood calculation of possible transmitted codewords ($\theta_1 \ldots \theta_i \ldots \theta_N$) and then comparing said $\theta_{max}$ value to a selected, calculated or predetermined scaled threshold $c \cdot \tau$ where $\tau$ is a threshold and c is a scaling factor for the threshold $\tau$. The comparison is such that, where $\theta_{max} > c \cdot \tau$, it is determined that the signal received on the UL (Continued)

at said UCI receiver comprises a linear block encoded signal. In some cases, the scaling factor c may be omitted.

21 Claims, 4 Drawing Sheets

(51) Int. Cl.
*H03M 13/13* (2006.01)
*H04L 27/26* (2006.01)
*H04L 5/00* (2006.01)

(56) References Cited

U.S. PATENT DOCUMENTS

| | | | |
|---|---|---|---|
| 8,315,185 | B2 | 11/2012 | Chun |
| 8,850,285 | B2 | 9/2014 | Liu et al. |
| 9,563,502 | B1 * | 2/2017 | Alhussien .......... G11C 11/5642 |
| 11,070,240 | B1 * | 7/2021 | Zalucki ................ H04B 1/0475 |
| 2015/0009952 | A1 | 1/2015 | Berggren et al. |
| 2017/0236592 | A1 * | 8/2017 | Alhussien ............ G11C 7/1006 |
| | | | 714/721 |

FOREIGN PATENT DOCUMENTS

| | | |
|---|---|---|
| CN | 105491591 A | 4/2016 |
| CN | 105262568 B | 9/2018 |
| CN | 109983723 A | 7/2019 |
| WO | WO 2013177738 A | 12/2013 |

OTHER PUBLICATIONS

Huawei, "Discussion on NR PUCCH demodulation performance," 3GPP TSG-RAN WGH meeting #87, May 25, 2018.
Intern. Search Report, PCT/CN2020/081130, dated Dec. 21, 2020.
Written Opinion, PCT/CN2020/081130, dated Dec. 21, 2020.

* cited by examiner

METHOD AND DEVICE FOR DETECTING DISCONTINUOUS TRANSMISSION (DTX) FOR SMALL BLOCK ENCODED SIGNALS

FIELD OF THE INVENTION

The invention relates particularly, but not exclusively, to an improved method and device for determining that a signal received on an uplink (UL) at an Uplink Control Information (UCI) receiver in a wireless communications system comprises a linear block encoded signal. The invention also relates to a method and device for improved detection of discontinuous transmission (DTX) on a UL at a UCI receiver particularly for small block encoded signals.

BACKGROUND OF THE INVENTION

In long-term evolution (LTE) communications systems, in a downlink (DL), a data payload is carried by transport blocks which are encoded into codewords which are sent over a DL physical data channel called the Physical Downlink Shared Channel (PDSCH). The scheduling information of the PDSCH codeword(s), including its resource allocation in the subframe and its modulation and coding scheme, is included in the physical control channel, called the Physical Downlink Control Channel (PDCCH). Generally, the receiving UE decodes the messages in PDCCH and, where it finds that a PDSCH has been assigned to it, it decodes the PDSCH codeword(s) according to the scheduling information decoded from the PDCCH.

In order to prevent the loss of transport blocks, LTE has adopted the Hybrid Automatic Repeat Request (HARQ) scheme. In the physical layer of E-UTRA, HARQ is implemented both in the UL and the DL. The acknowledgement message in E-UTRA is denoted as HARQ-ACK.

HARQ-ACK may be transmitted by the UE in response to certain PDSCH transmissions and includes one or several acknowledgements, either positive (ACK) or negative (NACK) in response to transport blocks transmitted in the DL. HARQ-ACK may be transmitted on one of the physical channels Physical Uplink Control Channel (PUCCH) or PUSCH.

If the eNodeB (base station (BS)) detects ACK instead of DTX, a so called ACK false detection, the eNodeB will erroneously consider the corresponding DL transport block as correctly received. Since the transport block has not been correctly received by the UE, corresponding data will not be passed to the Medium Access Control (MAC) layer and from the MAC layer to the Radio Link Control (RLC) layer. Data will hence be missing in the RLC layer. This will cause ARQ retransmissions in the RLC layer which introduce delay and possibly large retransmissions which is very undesirable. Also, if a NACK is detected erroneously that in reality is DTX, the eNodeB will retransmit the packet in such a way that the UE will not be capable of decoding it.

As already indicated, a problem arises when the UE is not aware of the presence of the PDSCH assigned to it if it fails to decode the PDCCH successfully. In this case the user equipment will not generate ACK/NACK information. This situation has been well recognized and the UE response in such case is DTX, that is, neither an ACK nor a NACK signal is transmitted to the eNodeB. Since the eNodeB has no prior knowledge of whether the UE has failed to detect the PDCCH, it expects or deems, that the symbols of the predetermined positions are ACK/NACK symbols and extracts them for the ACK/NACK decoder to decode.

If the eNodeB disregards the possibility of DTX, either an ACK or NACK message will be returned by the ACK/NACK decoder to a higher layer upon the decoding of the extracted symbols, which are, in fact, conveying no information. In general, both ACK and NACK messages are equally likely to be returned.

The consequence of wrongly detecting a DTX as an ACK is more adverse to the system performance than wrongly detecting a DTX into a NACK.

Similarly, in 5G (or new radio (NR)) wireless communication systems, a message feedback scheme is also used for re-transmission control. ACK or NACK (AN) signals are used to indicate whether the signal is received successfully or not by the UE and whether the BS needs to retransmit the data. If the UE misses a DL control signal, the UE may encounter DTX in DL and the UE will not send any message back to the BS. However, the BS needs to detect one of three possible feedback states, i.e. ACK, NACK or DTX, for rearranging a next transmission to the UE.

Figure 1:
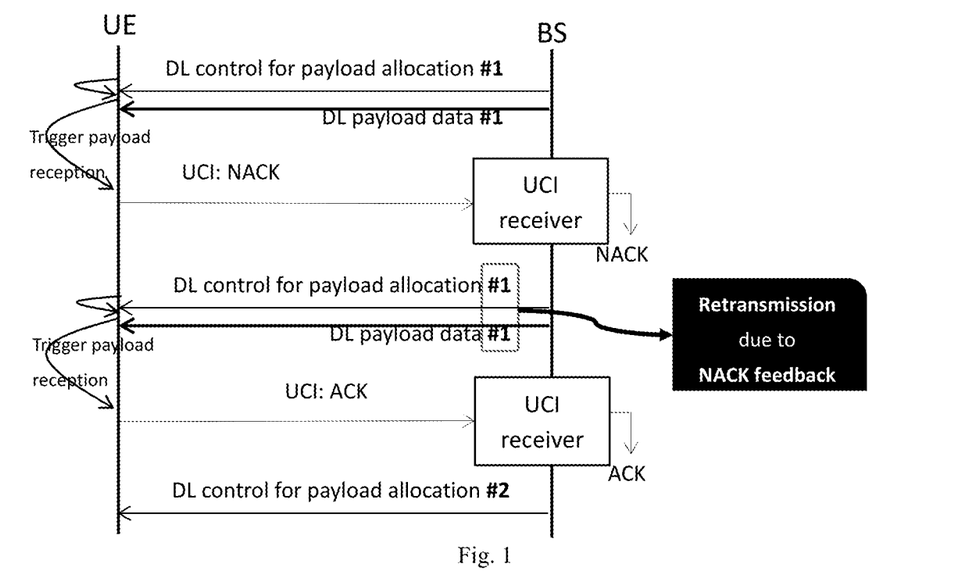
FIG. 1 is a signal diagram illustrating message exchanges between a BS and a UE for retransmission of control data and payload data.

FIG. 1 illustrates a method by which UL signals from the UE to the BS control transmission of payload control data and payload data on the DL from the BS to the UE. In the example of FIG. 1, it can be seen that, in response to a first "DL control for payload allocation #1" message from the BS to the UE, the UE, in this instance, responds with a UCI "NACK" message. The NACK message is received by the UCI receiver at the BS and, as a consequence, the BS is configured to retransmit to the UE the first "DL control for payload allocation #1" message and its associated first "DL payload data #1" message. In this example, the UE then returns a UCI "ACK" message to the UCI receiver in response to the retransmitted control signal message and, as a consequence, the BS is configured to then transmit to the UE the second "DL control for payload allocation #2" message and its associated second "DL payload data #2" message (not shown in FIG. 1). FIG. 1 therefore illustrates how data is retransmitted by the BS to the UE when the UE indicates that is has not successfully received a DL data control message.

Figure 2:
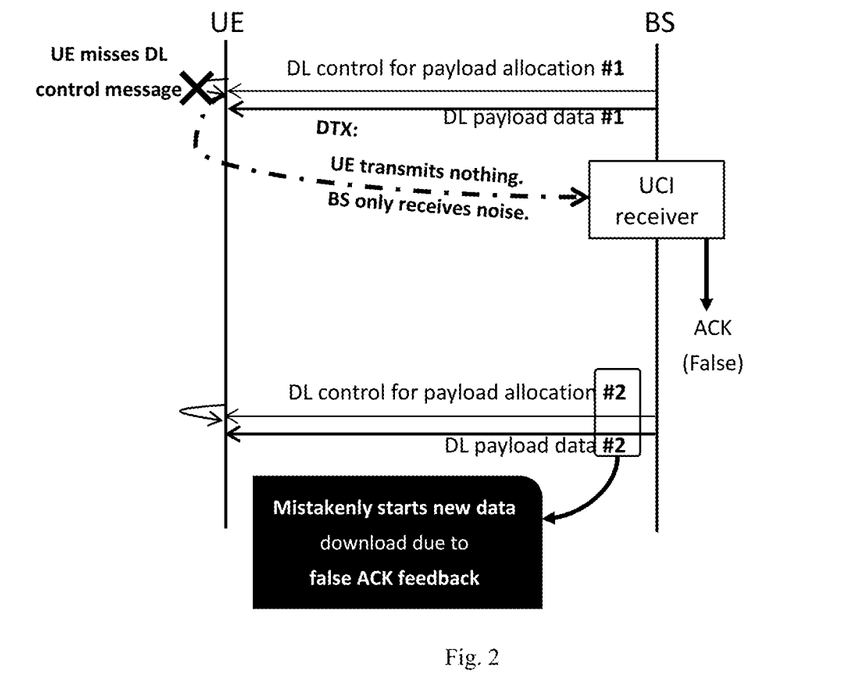
FIG. 2 is a signal diagram illustrating errant transmission of control data and payload data from a BS to a UE when a UCI receiver at the BS determines a false ACK message.

In contrast, FIG. 2 illustrates what may happen when the UE misses a DL data control message. In this example, the UE has missed the first "DL control for payload allocation #1" message and consequently sends no ACK/NACK message back to the BS in response. This scenario represents a DTX condition. The UCI receiver at the BS only receives noise but processes this as though it comprises a UL UCI signal with the result that, in this example, the UCI falsely detects or determines receipt of an ACK message from the UE and thus outputs a false ACK message. This causes the BS to commence a new control and payload data transmission in response to the false ACK message, e.g. "DL control for payload allocation #2", etc.

It will be understood that, in the example illustrated by FIG. 2 where the UCI receiver has no DTX detection or determination capability, the probability of the UCI receiver falsely detecting an ACK message is 50% with the remaining 50% of occasions resulting in a false NACK message. A false NACK message is less troublesome than a false ACK message but is still undesirable.

It is clear from the example of FIG. 2 that there is room for improvement in detecting or determining ACK or NACK messages from the UE at the UCI receiver and in distinguishing between ACK/NACK messages and DTX conditions.

CN105262568 relates to ACK/NACK and DTX detection in a wireless communication system where the DTX status threshold is calculated based on the statistics of signal-to-noise ratio (SNR). However, it can be challenging to obtain accurate noise estimations.

CN102740316 relates to a method for detecting an uplink DTX state. The method comprises receiving data information from uplink user equipment of the current cell; calculating a confidence value corresponding to the data information, wherein the confidence value is used for reflecting the accuracy of data information decoding carried out by a receiving terminal; comparing the confidence value with a preset DTX judgment threshold; and determining whether the uplink user equipment is in the DTX state or not according to a comparative result. Here, the preset DTX judgment threshold must change for different channel conditions and thus determination of the DTX judgment threshold requires considerable computational effort.

U.S. Pat. No. 8,850,285 relates to ACK/NACK/DTX detection in a wireless communication system disclosing a channel decoding block which receives a signal from the UE and produces a decoded ACK/NACK information vector.

U.S. Pat. No. 8,315,185 relates to ACK/NACK detection in an LTE wireless communication system. The ACK/NACK detector has a soft decoder and decision-maker. A threshold value is used to determine whether the transmitted signal from the UE contains an ACK/NACK transmission when the threshold value is met. If the threshold value is not met, the transmission is determined to be DTX. The threshold value is based on a power estimate of soft data bits.

Figure 3:
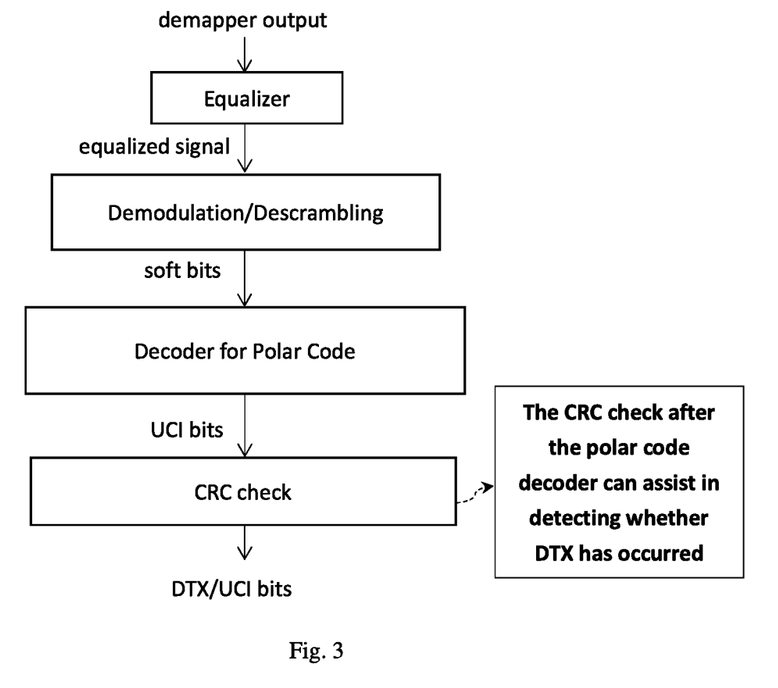
FIG. 3 is a block schematic diagram of a conventional polar code-based receiver for a 5G communications system.
Figure 4:
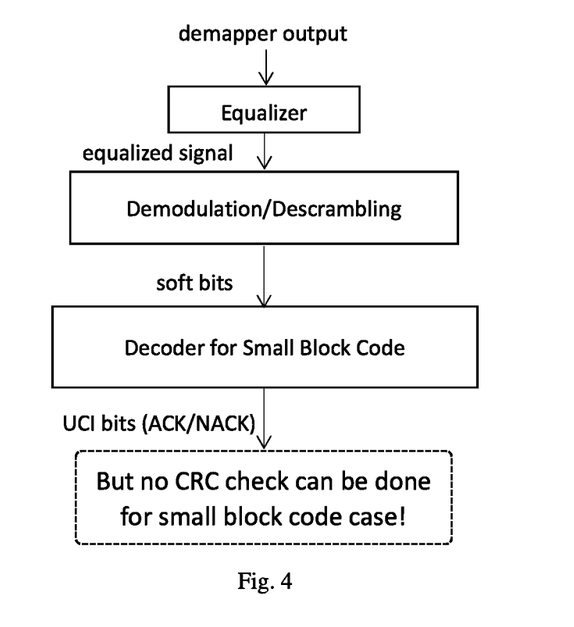
FIG. 4 is a block schematic diagram of a conventional small block code-based receiver for a 5G communications system.

For 5G UCI, 3GPP TS 38.212 requires the support of two types of channel codes, namely polar code and small block code as illustrated respectively by FIGS. 3 and 4. Polar code relates to the situation where the number of payload bits is greater than 11. Small block code relates to the situation where the number of payload bits is equal to or less than 11.

As shown in FIG. 3, in a conventional polar code-based receiver, a cyclic redundancy check (CRC) may assist in detecting whether or not DTX occurs. The output from the polar code decoder comprises UCI bits but the CRC check function (module) enables the polar code-based receiver to distinguish between DTX on the one hand and UCI bits indicative of ACK or NACK on the other hand.

In FIG. 4 which shows a conventional small block code-based receiver where a CRC function is not available, incorrect detection of the ACK, NACK, or DTX signals leads to a waste of resources for retransmission and/or a loss of data packets. In the conventional small block code-based receiver where CRC is not available, ACK and NACK each issue with 50% probability where the UE misses a DL control message and transmits nothing to the UE such that the BS receives only noise. In the small block code-based receiver, the output from the small block code decoder are assumed to be UCI bits leading to possible false ACK or false NACK outcomes. In other word, there is no means for distinguishing between DTX on the one hand and UCI bits indicative of ACK or NACK on the other hand.

What is desired is a method for detecting acknowledgment (ACK), negative acknowledgment (NACK) and discontinuous transmission (DTX) signals more accurately in wireless communication systems. What is also desired is a method of improving detection of DTX on a UL at a UCI receiver and/or a method of determining that a signal received on a UL at a UCI receiver comprises a linear block encoded signal.

OBJECTS OF THE INVENTION

An object of the invention is to mitigate or obviate to some degree one or more problems associated with known methods of determining that signals received on a UL at a UCI receiver comprise linear block encoded signals.

The above object is met by the combination of features of the main claims; the sub-claims disclose further advantageous embodiments of the invention.

Another object of the invention is to provide an improved method of detecting DTX on a UL at a UCI receiver especially for small block encoded signals.

Another object of the invention is to provide an improved UCI receiver and/or UCI decoder.

One skilled in the art will derive from the following description other objects of the invention. Therefore, the foregoing statements of object are not exhaustive and serve merely to illustrate some of the many objects of the present invention.

SUMMARY OF THE INVENTION

The invention concerns a method for processing a signal received at an uplink control information (UCI) receiver in a wireless communication system. The method comprises processing a signal received on an uplink (UL) at said UCI receiver to transform said received signal into a likelihood calculation of possible transmitted codewords ($\theta_1 \ldots \theta i \ldots \theta_N$). The method includes determining a maximum magnitude $\theta_{max}$ value from said likelihood calculation of possible transmitted codewords ($\theta_1 \ldots \theta i \ldots \theta_N$) and then comparing said $\theta_{max}$ value to a selected, calculated or predetermined scaled threshold $c \cdot \tau$ where $\tau$ is the threshold and c is a scaling factor for the threshold T. The comparison is such that, where $\theta_{max} > c \cdot \tau$, it is determined that the signal received on the UL at said UCI receiver comprises a linear block encoded signal. Preferably, where $\theta_{max} \leq c \cdot \tau$, a discontinuous transmission (DTX) signal is outputted.

In some cases, the scaling factor c can be omitted such that the method then comprises comparing said $\theta_{max}$ value directly to a unscaled threshold $\tau$ wherein, for $\theta_{max} > \tau$, it is determined that the signal received on the UL comprises a linear block encoded signal but, for $\theta_{max} \leq \tau$, a discontinuous transmission (DTX) signal is outputted.

Described is a device for processing a signal received at an uplink control information (UCI) receiver in a wireless communication system. The device comprises a receiver in a wireless communication system which is configured to process a signal received on an uplink (UL) at said UCI receiver to transform said received signal into a likelihood calculation of possible transmitted codewords ($\theta_1 \ldots \theta i \ldots \theta_N$). The likelihood calculation of possible transmitted codewords ($\theta_1 \ldots \theta i \ldots \theta_N$) may comprise a multi-dimensional discrete Fourier transform (DFT) ($\theta_1 \ldots \theta i \ldots \theta_N$) of said received signal. The multi-dimensional may be formed as a Hadamard Transform. The UCI receiver is configured to determine a maximum magnitude $\theta_{max}$ value from said likelihood calculation of possible transmitted codewords ($\theta_1 \ldots \theta i \ldots \theta_N$) and then compare said $\theta_{max}$ value to a selected, calculated or predetermined scaled threshold $c \cdot \tau$ where $\tau$ is the threshold and c is a scaling factor for the threshold $\tau$ such that, where $\theta_{max} > c \cdot \tau$, it is determined that the signal received on the UL at said UCI receiver comprises a linear block encoded signal. In some cases, the scaling factor c can be omitted.

In a first main aspect, the invention provides a method of processing a signal received at an uplink control information (UCI) receiver in a wireless communication system, the method comprising: processing a signal received on an uplink (UL) at said UCI receiver to transform said received signal into a likelihood calculation of possible transmitted codewords $(\theta_1 \ldots \theta_i \ldots \theta_N)$; determining a maximum magnitude $\theta_{max}$ value from said likelihood calculation of possible transmitted codewords $(\theta_1 \ldots \theta_i \ldots \theta_N)$; and comparing said $\theta_{max}$ value to a selected, calculated or predetermined scaled threshold $c \cdot \tau$ where c is a scaling factor for the threshold $\tau$ and said scaled threshold $c \cdot \tau$ is obtained by multiplying the threshold $\tau$ by the scaling factor c, the comparison being such that, where $\theta_{max} > c \cdot \tau$, the method comprises determining that the signal received on the UL at said UCI receiver comprises a linear block encoded signal.

Preferably, where $\theta_{max} \leq c \cdot \tau$, the method comprises outputting a discontinuous transmission (DTX) signal.

In one embodiment, the method includes the steps of: generating UCI bits based on a sign and an index of said $\theta_{max}$ value; and, where $\theta_{max} > c \cdot \tau$, outputting an acknowledgement (ACK) message or a negative-acknowledgement (NACK) message based on said UCI bits.

In another embodiment, the scaling factor c is omitted such that the step of comparing said $\theta_{max}$ value to the threshold $\tau$ comprises comparing said $\theta_{max}$ value directly to the threshold $\tau$. For $\theta_{max} > \tau$, the method includes determining that the signal received on the UL at said UCI receiver comprises a linear block encoded signal.

In this embodiment, where $\theta_{max} \leq \tau$, the method preferably comprises outputting a discontinuous transmission (DTX) signal.

In this embodiment, the method preferably includes the steps of: generating UCI bits based on a sign and an index of said $\theta_{max}$ value; and, where $\theta_{max} > \tau$, outputting an acknowledgement (ACK) message or a negative-acknowledgement (NACK) message based on said UCI bits.

In a second main aspect, the invention provides an uplink control information (UCI) receiver in a wireless communication system, the receiver comprising: a memory storing machine-readable instructions; and a processor for executing the machine-readable instructions such that, when the processor executes the machine-readable instructions, it configures the receiver to implement the steps of the first main aspect of the invention.

In a third main aspect, the invention provides a non-transitory computer-readable medium storing machine-readable instructions, wherein, when the machine-readable instructions are executed by a processor, they configure the processor to implement the steps of the first main aspect of the invention.

The summary of the invention does not necessarily disclose all the features essential for defining the invention; the invention may reside in a sub-combination of the disclosed features.

The forgoing has outlined fairly broadly the features of the present invention in order that the detailed description of the invention which follows may be better understood. Additional features and advantages of the invention will be described hereinafter which form the subject of the claims of the invention. It will be appreciated by those skilled in the art that the conception and specific embodiment disclosed may be readily utilized as a basis for modifying or designing other structures for carrying out the same purposes of the invention.

BRIEF DESCRIPTION OF THE DRAWINGS

The foregoing and further features of the present invention will be apparent from the following description of preferred embodiments which are provided by way of example only in connection with the accompanying figures, of which.

DESCRIPTION OF PREFERRED EMBODIMENTS

The following description is of preferred embodiments by way of example only and without limitation to the combination of features necessary for carrying the invention into effect.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments, but not other embodiments.

It should be understood that the elements shown in the FIGS., may be implemented in various forms of hardware, software or combinations thereof. These elements may be implemented in a combination of hardware and software on one or more appropriately programmed general-purpose devices, which may include a processor, memory and input/output interfaces.

The present description illustrates the principles of the present invention. It will thus be appreciated that those skilled in the art will be able to devise various arrangements that, although not explicitly described or shown herein, embody the principles of the invention and are included within its spirit and scope.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of systems and devices embodying the principles of the invention.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read-only memory ("ROM") for storing software, random access memory ("RAM"), and non-volatile storage.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. It is thus regarded that any means that can provide those functionalities are equivalent to those shown herein.

The invention relates to a method for detecting acknowledgment (ACK), negative acknowledgment (NACK) and discontinuous transmission (DTX) signals accurately in uplink control information (UCI) in wireless communication systems. It is particularly useful for DTX detection in small block code-based receivers where cyclic redundancy check CRC is not available for DTX detection.

Figure 5:
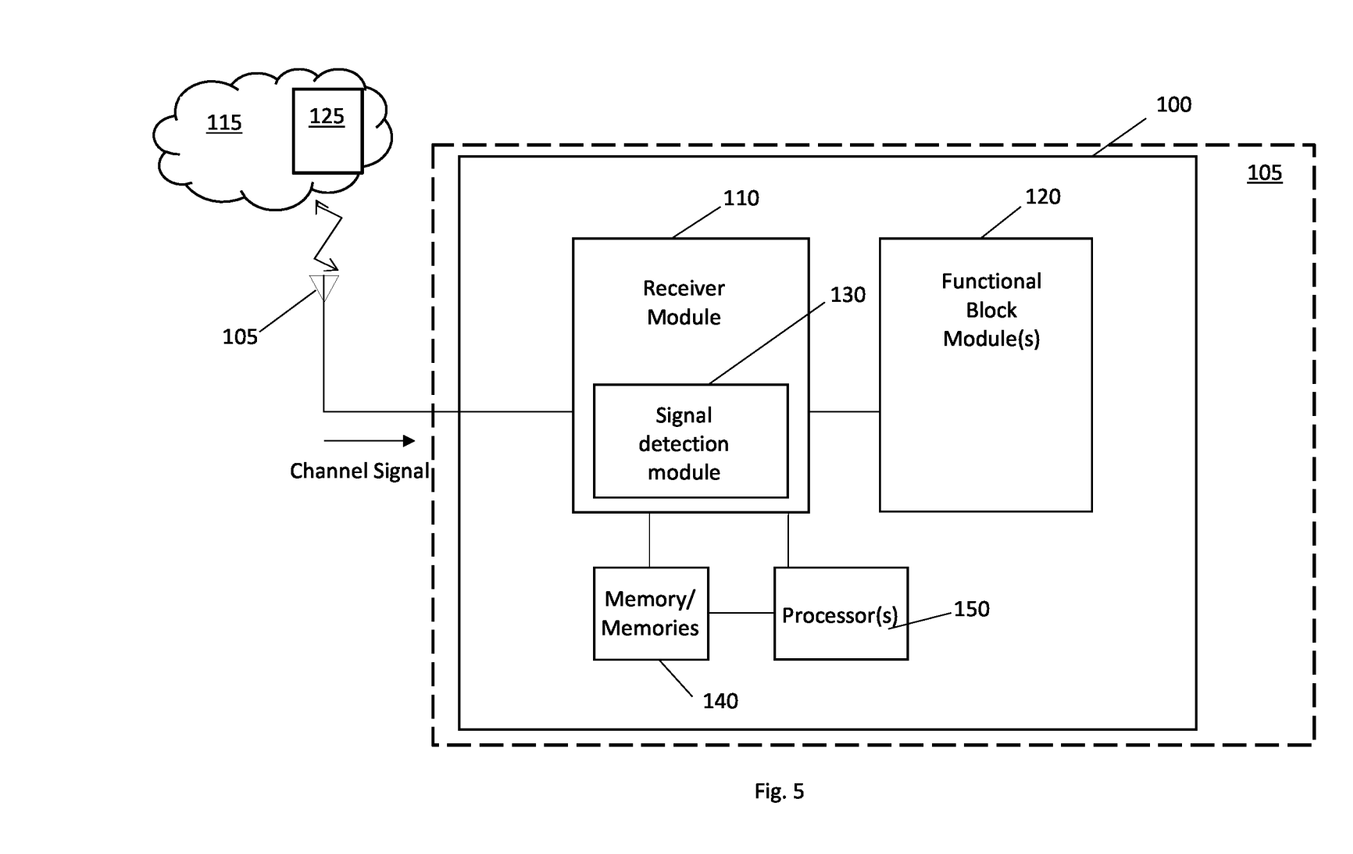
FIG. 5 is a block schematic diagram of a UCI receiver in accordance with the invention.

FIG. 5 shows an exemplary embodiment of an improved UCI receiver device 100 in accordance with concepts of the present invention. In the illustrated embodiment, the UCI receiver device 100 may comprise communication equipment such as a network node, a network card, or a network circuit communicatively connected to or forming part of a BS 105 (denoted by dashed line in FIG. 5), etc. operating in a 5G communications system environment 115, although the improved UCI receiver device 100 of the invention is not limited to operating in a 5G communications system but could comprise a UCI receiver device for a 4G cellular network or any cellular network.

The UCI receiver device 100 may comprise a plurality of functional blocks for performing various functions thereof. For example, the UCI receiver device 100 includes receiver module 110 providing received signal processing and configured to provide received signals and/or information extracted therefrom to functional block module(s) 120 such as may comprise various data sink, control element(s), user interface(s), etc. Although receiver module 110 is described as providing received signal processing, it will be appreciated that this functional block may be implemented as a transceiver providing both transmitted and received signal processing. Irrespective of the particular configuration of receiver 110, embodiments include signal detection module 130 disposed in association with the receiver module 110 for facilitating accurate processing and/or decoding of a received channel signal in accordance with the invention. Channel signals may be received via an antenna module 105.

Although the signal detection module 130 is shown as being deployed as part of the receiver module 110 (e.g. comprising a portion of the receiver module control and logic circuits), there is no limitation to such a deployment configuration according to the concepts of the invention. For example, the signal detection module 130 may be deployed as a functional block of UCI receiver device 100 that is distinct from, but connected to, receiver module 110. The signal detection module 130 may, for example, be implemented using logic circuits and/or executable code/machine readable instructions stored in a memory 140 of the UCI receiver device 100 for execution by a processor 150 to thereby perform functions as described herein. For example, the executable code/machine readable instructions may be stored in one or more memories 140 (e.g. random access memory (RAM), read only memory (ROM), flash memory, magnetic memory, optical memory or the like) suitable for storing one or more instruction sets (e.g. application software, firmware, operating system, applets, and/or the like), data (e.g. configuration parameters, operating parameters and/or thresholds, collected data, processed data, and/or the like), etc. The one or more memories 140 may comprise processor-readable memories for use with respect to one or more processors 150 operable to execute code segments of signal detection module 130 and/or utilize data provided thereby to perform functions of the signal detection module 130 as described herein. Additionally, or alternatively, the signal detection module 130 may comprise one or more special purpose processors (e.g. application specific integrated circuit (ASIC), field programmable gate array (FPGA), graphics processing unit (GPU), and/or the like configured to perform functions of the signal detection module 130 as described herein.

Figure 6:
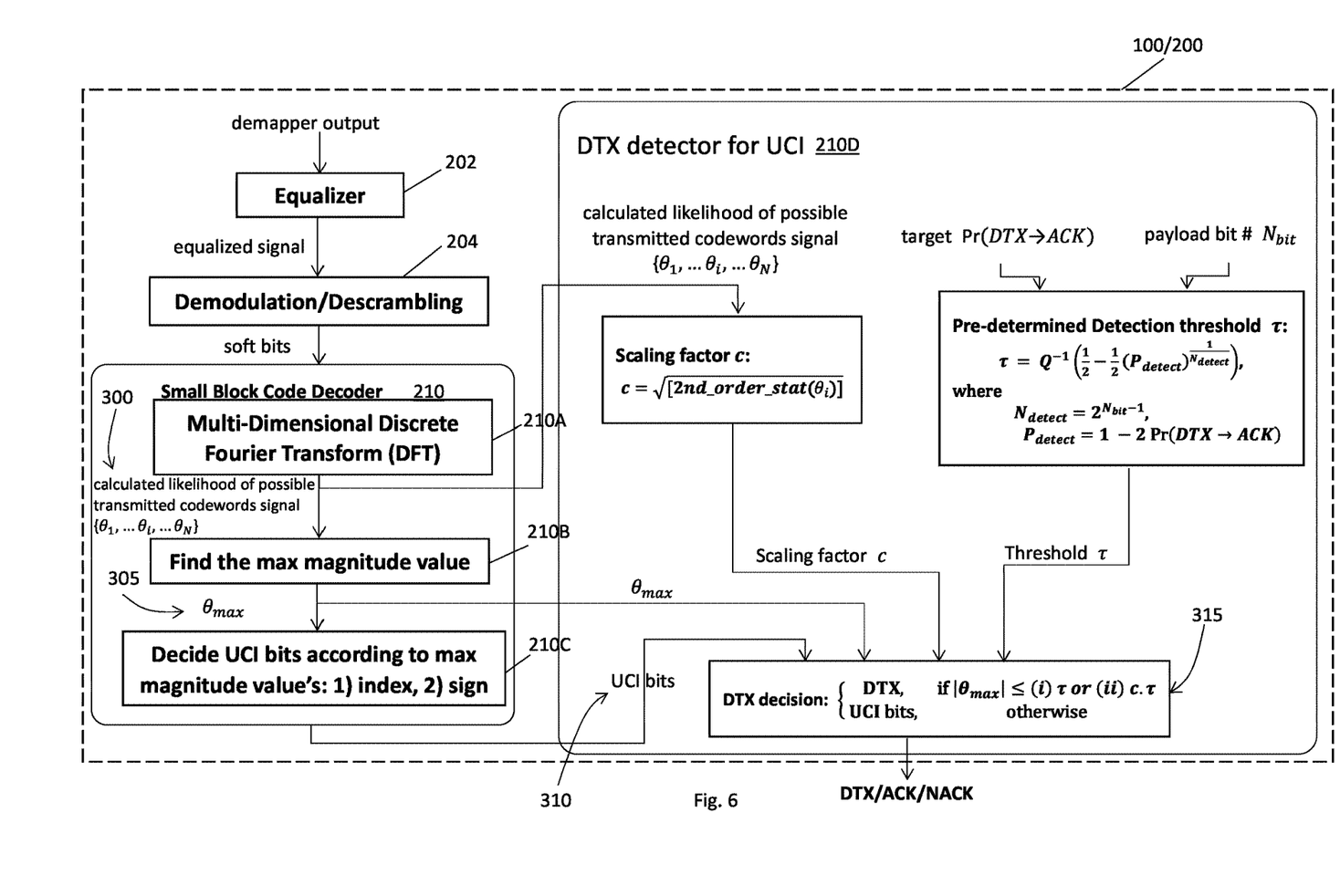
FIG. 6 is a diagram schematically illustrating method steps in accordance with the invention performed by the UCI receiver of FIG. 5.

FIG. 6 schematically illustrates an improved linear block code-based (UCI) receiver device 100/200, an improved decoder 210 for the improved linear block code-based (UCI) receiver device 100/200, and improved and enhanced methods implemented by the signal detection module 130 comprising the improved decoder 210 for the improved linear block code-based (UCI) receiver device 100/200 or for the UCI receiver device 100 of FIG. 5.

As described in greater detail below with respect to FIGS. 5 and 6, the signal detection module 130 comprising the improved decoder 210 is configured to implement improved detection or determination of acknowledgment (ACK), negative acknowledgment (NACK) and discontinuous transmission (DTX) signals accurately in uplink control information (UCI) in wireless communication systems.

In one embodiment, the UCI receiver device 100/200 is configured to receive a UL UCI signal as a demapper output signal. The demapper output signal is firstly equalized in a known manner in an equalizer module 202 to provide an equalized signal. The equalized signal is then demodulated and descrambled again in a known manner by a demodulation/descrambling module 204 which outputs soft bits to the improved decoder 210. In FIG. 6, the improved decoder 210 is shown as a small block code decoder 210 but it will be understood that this is shown by way of example only. The small block code decoder 210 is configured to process said received signal in a transform module 210A to transform, in step 300, said received signal into a likelihood calculation of possible transmitted codewords in said received signal. Preferably, the likelihood calculation of possible transmitted codewords comprises a multi-dimensional discrete Fourier transform (DFT) $(\theta_1 \ldots \theta_i \ldots \theta_N)$ of said received signal. The UL UCI signal is received at the UCI receiver device 100/200 from a UE 125 operating in the 5G communications system environment 115 and which is wirelessly connected to the BS 105 via a UL channel. However, it will be understood that the signal received at the UCI receiver device 100/200 may only comprise noise in an instance where the UE 125 has missed a DL control message from the BS 105 and the UE 125 has therefore not issued any message or signal in response to the missed DL control message. In this case, the UCI receiver device 100/200 anticipates receiving a reply message from the UE 125 and therefore treats received noise as a UL UCI signal to be processed. In either case, the small block code decoder 210 processes the 'received signal' whether it is a real UL UCI signal from the UE 125 or whether it is a noise signal mistakenly taken as being a real UL UCI signal from the UE 125 to transform said signal into the multi-dimensional discrete Fourier transform (DFT) ($\theta_1 \ldots \theta i \ldots \theta_N$).

As indicated above, the signal detection module 130 of FIG. 5 may comprise the improved decoder 210 for an improved linear block code-based (UCI) receiver device 100/200 of FIG. 6 with, in one embodiment, the improved decoder 210 replacing the polar code decoder forming part of the conventional polar code-based receiver of FIG. 3 or, more preferably, in another embodiment, the improved decoder 210 replacing, as shown in FIG. 6, the small block code decoder forming part of the conventional small block code-based receiver of FIG. 4.

It will be understood from the description that the signal detection module 130 comprising the improved decoder 210 may be implemented through any of software, firmware and/or hardware changes to conventional linear block code decoders, although it is possible to implement the improved decoder 210 of the invention by implementing only software changes.

The likelihood calculation of possible transmitted codewords in the UL UCI signal received at said UCI receiver device 100/200 may be expressed as likelihood values. The multi-dimensional DFT ($\theta_1 \ldots \theta i \ldots \theta_N$) may comprise a Hadamard transform of said received signal. The Hadamard transform is also known as the Walsh-Hadamard transform, the Hadamard-Rademacher-Walsh transform, the Walsh transform or the Walsh-Fourier transform. Herein, it will be referred to as the 'Hadamard transform' but encompasses all forms of said transform.

A module 210B of the small block code decoder 210 is configured to determine, in step 305, a maximum magnitude $\theta_{max}$ value from said likelihood calculation of possible transmitted codewords. The maximum magnitude $\theta_{max}$ value may be determined or calculated from a plurality of real numbers comprising said multi-dimensional DFT ($\theta_1 \ldots \theta i \ldots \theta_N$).

In conventional UCI receivers as exemplified by FIGS. 3 and 4, the UCI bits denoting ACK or NACK messages are derived from the maximum magnitude $\theta_{max}$ value's index and sign. Similarly, a UCI-bits module 210C of the small block code decoder 210 is configured to generate, in a known manner in step 310, UCI bits according to the index and sign of the maximum magnitude $\theta_{max}$ value.

As already described with respect to FIG. 4, the absence of a CRC function in the conventional small block code-based receiver prevents a determination of whether or not a received UL UCI signal is, in fact, indicative of a DTX condition rather than an ACK or NACK message. In other words, the absence of a CRC function prevents a determination being made between DTX on the one hand and ACK/NACK on the other hand.

Comparing said $\theta_{max}$ value to a selected, calculated or predetermined scaled threshold c·$\tau$ where c is a scaling factor for the threshold $\tau$ and said scaled threshold c·$\tau$ is obtained by multiplying the threshold $\tau$ by the scaling factor c, the comparison being such that, where $\theta_{max}$>c·$\tau$, the method comprises determining that the signal received on the UL at said UCI receiver comprises a linear block encoded signal.

A first embodiment of the method of the invention denoted as (ii) in FIG. 6 includes, in step 315, the step of comparing said $\theta_{max}$ value to a selected, calculated or predetermined scaled threshold c·$\tau$ where c is a scaling factor for the threshold $\tau$ and said scaled threshold c·$\tau$ is obtained by multiplying the threshold $\tau$ by the scaling factor c. The determined, selected or calculated scaling factor c may be obtained by a DTX detector for UCI module 210D by estimating the scaling factor c from the multi-dimensional DFT ($\theta_1 \ldots \theta i \ldots \theta_N$) but is preferably obtained by calculating a square root of the second order statistics of the multi-dimensional DFT ($\theta_1 \ldots \theta i \ldots \theta_N$), i.e.: c=$\sqrt{[2nd\_order\_stat(\theta_i)]}$.

The scaling factor c is directly based on the calculated likelihood of possible transmitted codewords and, as such, has low computational complexity and has stable performance as it does not depend on obtaining a signal noise estimation.

The DTX detector for UCI module 210D for the small block code decoder 210 has loaded into a memory thereof the predetermined threshold T. The threshold $\tau$ is preferably derived from a target detection performance and a number of detection occurrences in the signal received on the UL at said UCI receiver device 100/200. The target detection performance may comprise any of: a target probability of detecting DTX as an acknowledgement message (ACK) (Pr(DTX→ACK)); a target probability of detecting DTX as a transmitted message (TX) (Pr(DTX→+TX)); or a target probability of detecting a false alarm (Pr(FA)) in the signal received on the UL at said UCI receiver device 100/200. The number of detection occurrences is preferably determined from a number of payload bits and/or a number of encoded bits in the signal received on the UL at said UCI receiver device 100/200.

The threshold $\tau$ may also be determined according to a tail probability of the distribution of the multi-dimensional DFT ($\theta_1 \ldots \theta i \ldots \theta_N$).

More particularly, the threshold $\tau$ is derived from:

$$\tau = Q^{-1}\left(\frac{1}{2} - \frac{1}{2}(P_{detect})^{\frac{1}{N_{detect}}}\right),$$

where
where $Q^{-1}(\cdot)$ is the inverse Q-function
$N_{detect}=2^{N_{bit}-1}$
$P_{detect}=$1–2 Pr(DTX→ACK), or 1–Pr(DTX→TX), or 1–Pr(FA), and
$N_{bit}$ is a number of payload bits and/or a number of encoded bits in the in the signal received on the UL at said UCI receiver device 100/200.

In FIG. 6, only $P_{detect}=$1–2 Pr(DTX→ACK) is shown for clarity of the drawing.

The threshold $\tau$ is dependent on two inputs, namely the target probability and the number of payload bits and/or a number of encoded bits as hereinbefore described. As such, the threshold $\tau$ can be predetermined and loaded into the memory 140 of the UCI receiver device 100/200. As such, the threshold $\tau$ does not necessarily need to be determined in real-time. Furthermore, the scaled threshold c.$\tau$ is suitable for different channels or channel conditions which greatly simplifies the method of the invention and reduces the computational workload in the signal detection module 130/small block code decoder 210.

The small block code decoder 210 is configured, in step 315, to determine whether or not the signal received on the UL at said UCI receiver device 100/200 comprises a linear block encoded signal when $\theta_{max} > c \cdot \tau$. However, where $\theta_{max} \leq c \cdot \tau$, a discontinuous transmission (DTX) signal is outputted at step 315.

In the case where $\theta_{max} > c \cdot \tau$, step 315 may be enhanced to output an acknowledgement (ACK) message or a negative-acknowledgement (NACK) message based on the generated UCI bits.

It can be seen therefore that the method of this embodiment can be most usefully, although not exclusively, utilized in a small block code-based receiver not having CRC functionality such as that exemplified by FIG. 4 to determine if a signal received on the UL at the UCI receiver device 100/200 comprises a linear block encoded signal and furthermore to detect or determine if the received signal, whether real or comprising noise, includes an ACK message from the UE 125 or a NACK message from the UE 125. In other words, not only can the method of the first embodiment determine if the received signal comprises a linear block encoded signal or not but it also enables the improved decoder 210 to distinguish between a DTX condition on the one hand and ACK/NACK signals on the other hand. Consequently, the method of the first embodiment is particularly useful in wireless communication systems for DTX detection in small block code-based receivers where cyclic redundancy check CRC is not available for DTX detection.

The method can therefore be utilized to determine that the signal received on the UL at the UCI receiver device 100/200 comprises a small block encoded signal in a long-term evolution (LTE) communication system and, more particularly, to determine DTX in a small block encoded signal comprising a NR (5G) Physical Uplink Control Channel (PUCCH) format such as PUCCH format 2, PUCCH format 3, or PUCCH format 4.

It will be understood that the linear block code may be Reed-Muller (RM) code or RM-based super code.

In general, signal power varies over time. In a case of DTX, for example, where the received signal only comprises noise, the noise power is not constant over time. Therefore, it is necessary to estimate the noise power (e.g., based on all of $(\theta_1 \ldots \theta_i \ldots \theta_N)$), at one or more points in time. Otherwise the maximum magnitude $\theta_{max}$ value derived from the received signal comprising only noise may still be such that the maximum magnitude max value is greater than the threshold T, due to the fact that $(\theta_1 \ldots \theta_i \ldots \theta_N)$ are all/mostly large on the whole, rather than due to the fact that $\theta_{max}$ is really outstanding among $(\theta_1 \ldots \theta_i \ldots \theta_N)$. Using a scaling factor c with the threshold $\tau$ helps to address this problem.

On the other hand, it is possible that a scaling factor c can be omitted in, for example, the case where we have a priori knowledge of the noise power over a long period of time. In this case, it is possible to determine that noise on the UL channel does not vary rapidly over time or to determine that it follows a certain distribution. In this way, it is possible to treat the noise power as a constant or at least a known entity. Consequently, as long as a suitable level for the threshold $\tau$ is chosen, it no longer becomes necessary to apply a scaling factor to the threshold $\tau$.

Referring again to FIGS. 5 and 6, in another embodiment of the method of the invention denoted as (i) in FIG. 6, the step of selecting, calculating or determining the scaling factor is omitted. In the enhanced method (i) of FIG. 6, the method includes the step 310 of the signal detection module 130 comprising the improved decoder 210 generating UCI bits according to the index and sign of the maximum magnitude $\theta_{max}$ value in a known manner. The enhanced method also comprises the enhanced step 315 of comparing said $\theta_{max}$ value directly to the threshold $\tau$.

For $\theta_{max} > \tau$, the method includes determining that the signal received on the UL at said UCI receiver device 100/200 comprises a linear block encoded signal.

The small block code decoder 210 is configured, in enhanced step 315, to determine that the signal received on the UL at said UCI receiver device 100 comprises a linear block encoded signal when $\theta_{max} > \tau$. However, where $\theta_{max} \leq \tau$, a discontinuous transmission (DTX) signal is outputted at enhanced step 315.

In the case where $\theta_{max} > \tau$, enhanced step 315 may output an acknowledgement (ACK) message or a negative-acknowledgement (NACK) message based on the generated UCI bits.

The invention provides a UCI receiver device 100 for a wireless communication system. The UCI receiver device 100 comprises a memory 140 storing machine-readable instructions and a processor 150 for executing the machine-readable instructions such that, when the processor 150 executes the machine-readable instructions, it configures the UCI receiver device 100 to implement the afore-described methods (i) and (ii) in accordance with the invention.

The invention provides a non-transitory computer-readable medium 140 storing machine-readable instructions, wherein, when the machine-readable instructions are executed by a processor 150, they configure the processor 150 to implement the afore-described methods (i) and (ii) in accordance with the invention.

The apparatus described above may be implemented at least in part in software. Those skilled in the art will appreciate that the apparatus described above may be implemented at least in part using general purpose computer equipment or using bespoke equipment.

Here, aspects of the methods and apparatuses described herein can be executed on any apparatus comprising the communication system. Program aspects of the technology can be thought of as "products" or "articles of manufacture" typically in the form of executable code and/or associated data that is carried on or embodied in a type of machine readable medium. "Storage" type media include any or all of the memory of the mobile stations, computers, processors or the like, or associated modules thereof, such as various semiconductor memories, tape drives, disk drives, and the like, which may provide storage at any time for the software programming. All or portions of the software may at times be communicated through the Internet or various other telecommunications networks. Such communications, for example, may enable loading of the software from one computer or processor into another computer or processor. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to tangible non-transitory "storage" media, terms such as computer or machine "readable medium" refer to any medium that participates in providing instructions to a processor for execution.

While the invention has been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

It is to be understood that, if any prior art publication is referred to herein, such reference does not constitute an admission that the publication forms a part of the common general knowledge in the art.

The invention claimed is:

1. A method of processing a signal received at an uplink control information (UCI) receiver in a wireless communication system, the method comprising:
processing a signal received on an uplink (UL) at said UCI receiver to transform said received signal into a likelihood calculation of possible transmitted codewords $(\theta_1 \ldots \theta_i \ldots \theta_N)$;
determining a maximum magnitude $\theta_{max}$ value from said likelihood calculation of possible transmitted codewords $(\theta_1 \ldots \theta_i \ldots \theta_N)$; and
comparing said $\theta_{max}$ value to a selected, calculated or predetermined scaled threshold $c \cdot \tau$ where $\tau$ is a threshold and c is a scaling factor for the threshold $\tau$ and said scaled threshold $c \cdot \tau$ is obtained by multiplying the threshold $\tau$ by the scaling factor c, the comparison being such that, where $\theta_{max} > c \cdot \tau$, the method comprises determining that the signal received on the UL at said UCI receiver comprises a linear block encoded signal.

2. The method of claim 1, wherein, where $\theta_{max} \leq c \cdot \tau$, the method comprises outputting a discontinuous transmission (DTX) signal.

3. The method of claim 1, wherein the likelihood calculation of possible transmitted codewords $(\theta_1 \ldots \theta_i \ldots \theta_N)$ comprises a multi-dimensional discrete Fourier Transform (DFT) $(\theta_1 \ldots \theta_i \ldots \theta_N)$ of said signal received on the UL at said UCI receiver and the maximum magnitude $\theta_{max}$ value is derived from a plurality of real numbers comprising said multi-dimensional DFT.

4. The method of claim 3, wherein the multi-dimensional DFT $(\theta_1 \ldots \theta_i \ldots \theta_N)$ comprises a Hadamard transform of the signal received on the UL at said UCI receiver.

5. The method of claim 3, wherein the threshold $\tau$ is determined according to a tail probability of the distribution of the multi-dimensional DFT $(\theta_1 \ldots \theta_i \ldots \theta_N)$.

6. The method of claim 1, wherein the threshold $\tau$ is derived from a target detection performance and a number of detection occurrences in the signal received on the UL at said UCI receiver.

7. The method of claim 6, wherein the target detection performance comprises any of: a target probability of detecting DTX as an acknowledgement message (ACK) (Pr(DTX→ACK)); a target probability of detecting DTX as transmitted (TX) (Pr(DTX→TX)); or a target probability of detecting a false alarm (Pr(FA)) in the signal received on the UL at said UCI receiver.

8. The method of claim 6, wherein the number of detection occurrences is determined from a number of payload bits and/or a number of encoded bits in the signal received on the UL at said UCI receiver.

9. The method of claim 6, wherein the threshold $\tau$ is derived from:

$$\tau = Q^{-1}\left(\frac{1}{2} - \frac{1}{2}(P_{detect})^{\frac{1}{N_{detect}}}\right),$$

where
where $Q^{-1}(\cdot)$ is the inverse Q-function
$N_{detect} = 2^{N_{bit}-1}$
$P_{detect} = 1 - 2\Pr(DT \to ACK)$, or $1 - \Pr(DTX \to TX)$, or $1 - \Pr(FA)$, and
$N_{bit}$ is a number of payload bits and/or a number of encoded bits in the signal received on the UL at said UCI receiver.

10. The method of claim 1, wherein determining, selecting or calculating the scaling factor c comprises estimating the scaling factor c from a multi-dimensional DFT $(\theta_1 \ldots \theta_i \ldots \theta_N)$ of the signal received on the UL at said UCI receiver.

11. The method of claim 10, wherein the step of determining, selecting or calculating the scaling factor c is omitted such that the comparison step comprises comparing said $\theta_{max}$ value directly to the threshold $\tau$ such that, where $\theta_{max} > \tau$, the method comprises determining that the signal received on the UL at said UCI receiver comprises a linear block encoded signal.

12. The method of claim 11, including the steps of:
generating UCI bits based on said $\theta_{max}$ value; and,
where $\theta_{max} > \tau$, outputting an acknowledgement (ACK) message or a negative-acknowledgement (NACK) message based on said UCI bits.

13. The method of claim 10, wherein the step of determining, selecting or calculating the scaling factor c is omitted such that the comparison step comprises comparing said $\theta_{max}$ value directly to the threshold $\tau$ such that, $\theta_{max} \leq \tau$, the method comprises outputting a discontinuous transmission (DTX) signal.

14. The method of claim 1, wherein determining, selecting or calculating the scaling factor c comprises calculating a square root of second order statistics of a multi-dimensional DFT $(\theta_1 \ldots \theta_i \ldots \theta_N)$ of the signal received on the UL at said UCI receiver.

15. The method of claim 1, including the steps of:
generating UCI bits based on said $\theta_{max}$ value; and,
where $\theta_{max} > c \cdot \tau$, outputting an acknowledgement (ACK) message or a negative-acknowledgement (NACK) message based on said UCI bits.

16. The method of claim 1, wherein the scaling factor c=1.

17. The method of claim 1, wherein the method is utilized to determine that the signal received on the UL at said UCI receiver comprises a small block encoded signal in a long-term evolution (LTE) communication system.

18. The method of claim 17, wherein the method is utilized to determine DTX in a small block encoded signal comprising a new radio (NR) Physical Uplink Control Channel (PUCCH) format such as PUCCH format 2, PUCCH format 3, or PUCCH format 4.

19. The method of claim 1, wherein the linear block code comprises Reed-Muller (RM) code or RM-based super code.

20. An uplink control information (UCI) receiver in a wireless communication system, the receiver comprising:
- a memory storing machine-readable instructions; and
- a processor for executing the machine-readable instructions such that, when the processor executes the machine-readable instructions, it configures the receiver to:
- process a signal received on an uplink (UL) at said UCI receiver to transform said received signal into a likelihood calculation of possible transmitted codewords ($\theta_1 \ldots \theta i \ldots \theta_N$);
- determine a maximum magnitude $\theta_{max}$ value from said likelihood calculation of possible transmitted codewords ($\theta_1 \ldots \theta i \ldots \theta_N$); and
- compare said $\theta_{max}$ value to a selected, calculated or predetermined scaled threshold $c \cdot \tau$ where $\tau$ is a threshold and c is a scaling factor for the threshold $\tau$ and said scaled threshold $c \cdot \tau$ is obtained by multiplying the threshold $\tau$ by the scaling factor c, the comparison being such that, where $\theta_{max} > c \cdot \tau$, the method comprises determining that the signal received on the UL at said UCI receiver comprises a linear block encoded signal.

21. A non-transitory computer-readable medium storing machine-readable instructions, wherein, when the machine-readable instructions are executed by a processor, they configure the processor to:
- process a signal received on an uplink (UL) at said UCI receiver to transform said received signal into a likelihood calculation of possible transmitted codewords ($\theta_1 \ldots \theta i \ldots \theta_N$);
- determine a maximum magnitude $\theta_{max}$ value from said likelihood calculation of possible transmitted codewords ($\theta_1 \ldots \theta i \ldots \theta_N$); and
- compare said $\theta_{max}$ value to a selected, calculated or predetermined scaled threshold $c \cdot \tau$ where $\tau$ is a threshold and c is a scaling factor for the threshold $\tau$ and said scaled threshold $c \cdot \tau$ is obtained by multiplying the threshold $\tau$ by the scaling factor c, the comparison being such that, where $\theta_{max} > c \cdot \tau$, the method comprises determining that the signal received on the UL at said UCI receiver comprises a linear block encoded signal.

* * * * *